United States Patent
Du et al.

(12) 
(10) Patent No.: US 6,563,181 B1
(45) Date of Patent: May 13, 2003

(54) HIGH FREQUENCY SIGNAL ISOLATION IN A SEMICONDUCTOR DEVICE

(75) Inventors: Yang Du, Austin, TX (US); Suman Kumar Banerjee, Mesa, AZ (US); Rainer Thoma, Gilbert, AZ (US); Alain Duvallet, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/003,535

(22) Filed: Nov. 2, 2001

(51) Int. Cl.[7] .............................................. H01L 29/96
(52) U.S. Cl. ...................... 257/394; 257/127; 257/544; 257/549; 257/546; 257/550; 257/509; 257/547; 257/275
(58) Field of Search ............................... 257/544, 394, 257/127, 549, 546, 550, 509, 547, 275

(56) References Cited

U.S. PATENT DOCUMENTS 6,349,067 B1 * 2/2002 Hsu et al. ................. 365/206

OTHER PUBLICATIONS

Wu, "A High Aspect–Ratio Silicon Substrate–Via Technology and Applications: Through–Wafer Interconnects for Power and Ground and Faraday Cages for SOC Isolation," IEEE, 4 pp. (2000).

Jordar, "A Simple Approach to Modeling Cross–Talk in Integrated Circuits," IEEE Journal of Solid–State Circuits, vol. 29, No. 10, Oct. 1994, pp. 1212–1219.

Hamel, Substrate Crosstalk Suppression Capability of Silicon–on–Insulator Substrates with Buried Ground Planes (GPSOI), IEEE Microwave and Guided Wave Letters, vol. 10, No. 4, Apr. 2000, pp. 134–135.

* cited by examiner

*Primary Examiner*—Tom Thomas
*Assistant Examiner*—Junghwa Im
(74) *Attorney, Agent, or Firm*—Daniel D. Hill; Joanna G. Chiu

(57) ABSTRACT

A semiconductor device (20) includes an isolated p-well (22) formed in a substrate (21) by a buried n-well (25) and an n-well ring (24). The n-well ring (24) extends from a surface of the semiconductor device (20) to the buried n-well (25). The isolated p-well (22) includes a plurality of n-well plugs (27) extending from the surface of the semiconductor device (20) into the isolated p-well (22) and contacting the buried n-well (25). The plurality of n-well plugs (27) reduces an n-well resistance to provide better noise isolation for high frequency signals.

20 Claims, 2 Drawing Sheets

HIGH FREQUENCY SIGNAL ISOLATION IN A SEMICONDUCTOR DEVICE

FIELD OF THE INVENTION

The present invention relates generally to semiconductor devices, and more particularly, to high frequency signal isolation in a semiconductor device.

BACKGROUND OF THE INVENTION

To reduce cost in integrated circuit design, it is desirable to include as much functionality as possible on a single integrated circuit. For example, in a low cost wireless communication system, it is desirable to include the RF (radio frequency) circuits on the same integrated circuit as the digital logic circuits. However, noise generated by the digital logic circuits can be injected into sensitive RF circuit blocks such as phase locked loops (PLL) and low noise amplifier circuits. Conceptually, an ideal Faraday cage prohibits external electromagnetic interference and provides perfect signal isolation. In an integrated circuit, implanted wells are used to reduce the effect of noise and to provide signal isolation. In a CMOS twin well process with a p-type substrate, the pn junction between n-well and p-type substrate provides some signal isolation for PMOS. The NMOS signal isolation is accomplished using a deep n+ implant (DNW) with an n-well to create an isolated p-well (IPW) pocket, and is sometimes referred to as a triple well process. Implanted wells as used to approximate a Faraday cage in integrated circuits, reduce the effect of noise. However, the use of implanted wells fails to provide adequate signal isolation at higher RF frequencies.

FIG. 1 illustrates a top view of a prior art semiconductor device 10. FIG. 2 illustrates a cross-sectional view of the prior art semiconductor device 10 of FIG. 1. Semiconductor device 10 has a p substrate 18. A deep n-well implant 16 together with a n-well ring 15 creates an-isolated p-well pocket 12. A plurality of p+ well ties 14 is implanted in the surface of the isolated p-well 12. Electronic circuits are built into the surface of the isolated p-well (not shown). The isolated p-well 12 functions to isolate the circuits implemented in the well from circuits that are implemented outside of the well. However, the deep n-well implant 16 has a relatively high resistance that is undesirable for signal isolation in the RF frequency range.

DETAILED DESCRIPTION

Figure 1:
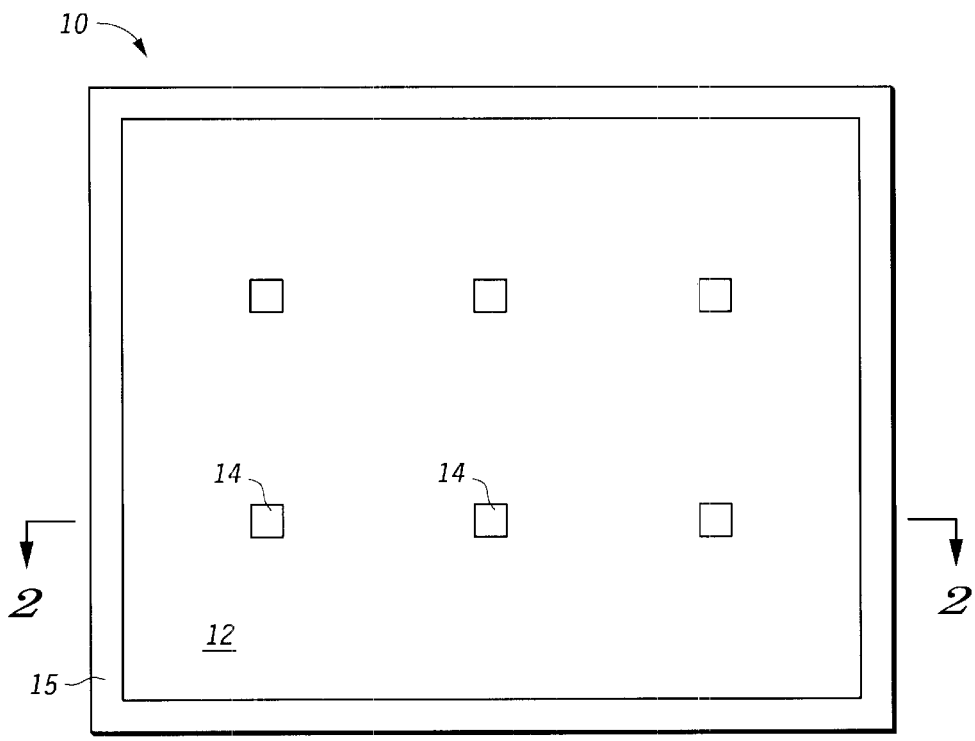
FIG. 1 illustrates a top view of a prior art semiconductor device.
Figure 2:
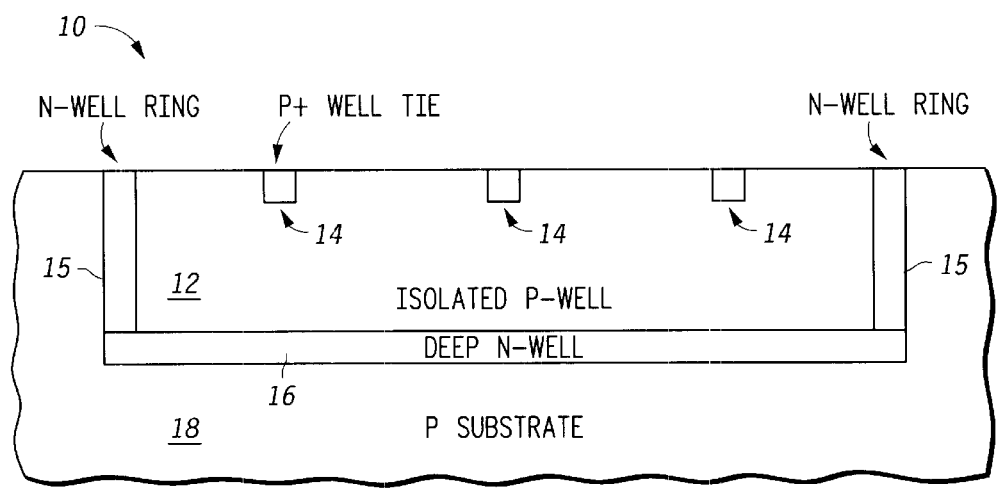
FIG. 2 illustrates a cross-sectional view of the prior art semiconductor device of FIG. 1.

Generally, the present invention provides a semiconductor device 20 having a substrate 21, a buried n-well 25, and an n-well ring 24. The n-well ring 24 extends from a surface of the semiconductor device 20 to the buried n-well 25. The n-well ring 24 and the buried n-well 25 form an isolated p-well 22. The isolated p-well 22 includes a plurality of n-well plugs 27 extending from the surface into the isolated p-well 22 and contacting the buried n-well 25. The plurality of n-well plugs 27 reduces an n-well resistance to provide better isolation for high frequency signals.

Figure 3:
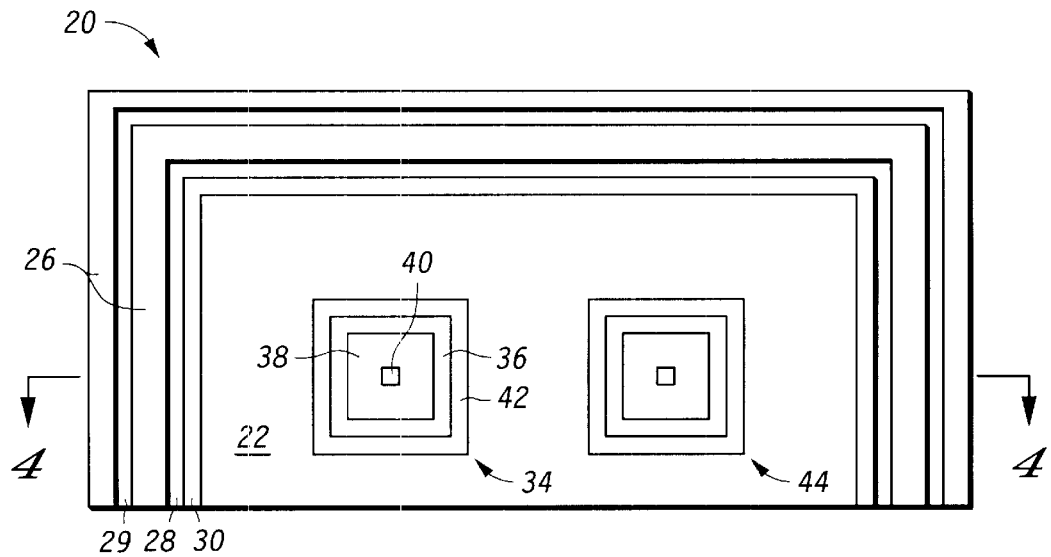
FIG. 3 illustrates a top view of a semiconductor device in accordance with the present invention.
Figure 4:
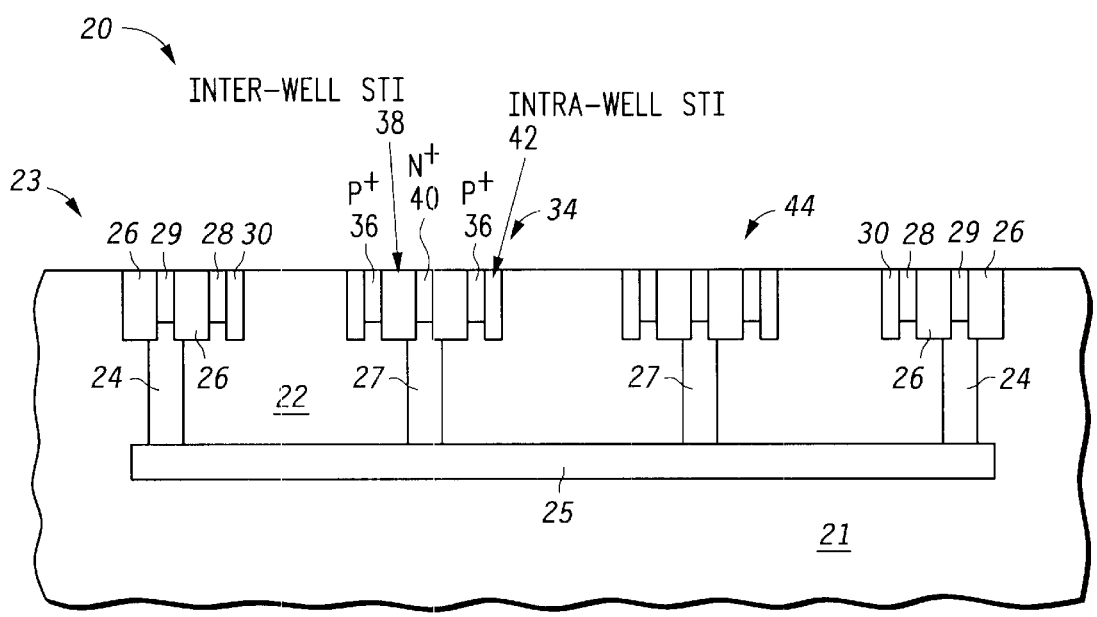
FIG. 4 illustrates a cross-sectional view of the semiconductor device of FIG. 3.

FIG. 3 illustrates a top view of a portion of a semiconductor device 20 in accordance with the present invention. FIG. 4 illustrates a cross-sectional view of semiconductor device 20 of FIG. 3 along the line 4—4. Referring to both FIG. 3 and FIG. 4, semiconductor device 20 includes a substrate 21, deep n-well 25, composite well ring 23, and composite well ties 34 and 44. An isolated p well 22 is formed by deep n-well 25 and n-well ring 24. Composite well ring 23 includes n-well ring 24, inter-well STI (shallow trench isolation) 26, intra-well STI 30, n+ active 29, and p+ active 28. Composite well tie 34 includes n-well plug 27, p+ active 36, inter-well STI 38, n+ active 40, and intra-well STI 42. A plurality of composite well ties, similar to composite well tie 34, are spaced throughout isolated p-well 22. However, for the purpose of illustration, only one other composite well tie, composite well tie 44, is illustrated in FIGS. 3 and 4.

Deep n-well 25 is first implanted in substrate 21. Then, n-well ring 24 is implanted over deep n-well 25 to construct isolated p-well 22. Inter-well STI 26, intra-well STI 30, n+ active 29, and p+ active 28 are formed over n-well 24 and isolated p-well 22. Composite-well ties 34 and 44 are formed at the same time, and with the same mask, as composite n-well ring 23. The n-well plug 27 is formed at the same time as n-well ring 24. The n-well plug 27 is doped with a concentration in a range of approximately 1e17 atom/cm$^3$ to 1e19 atom/cm$^3$, and the buried n-well 25 is doped with a concentration in a range of approximately 1e17 atom/cm$^3$ to 5e19 atom/cm$^3$. Then p+ active 36, inter-well STI 38, n+ active 40, and intra-well STI 42 are formed over n-well plug 27. The p+ active 36 forms a guard ring around the n-well plugs to eliminate process sensitive leakage and to make the composite n-well ties more robust.

Because of Ohm's parallel resistor law, more n-well ties in the isolated p-well results in lower resistance. However, the additional n-well ties reduce resistance at the cost of increased surface area of the integrated circuit. In the illustrated embodiment, the composite n-well ties are evenly spaced apart from each other at a distance of less than approximately 50 microns. Reducing n-well tie spacing, and thus increasing the number of n-well ties, results in better signal isolation quality. Each of the plurality of n-well plugs 34 have a length in a range of approximately 0.5 microns to 1.0 microns and a width in a range of approximately 0.5 microns to 1.0 microns. In other embodiments, the composite n-well ties can be spaced further apart than 50 microns and may be spaced in an uneven manner to accommodate circuit layout or other concerns. Also, the n-well plugs may have different lengths and widths. For example, in one embodiment, the n-well plug may be rectangular in shape forming a strip.

Composite well ties 34 and 44 are used to make contact to the deep n-well 25, and reduce the deep n-well resistance of buried n-well 25 by providing a plurality of parallel conductive paths though isolated p-well 22. Also, composite n-well ties 34 and 44 can be implanted inside isolated p-well 22 using the same mask as n-well ring 24. After p-well implantation, n+ active region 40 and p+ active region 36 are formed to make ohmic contact to the well. In the illustrated embodiment, both the composite well ring 23 and composite well ties 34 and 44 have a similar structure to achieve optimum signal isolation. As the frequency increases, a lumped well resistance Rw determines the amount of signal isolation.

The lumped well resistance can be shown by the following equation: $Rw = Rnw \cdot Rpw / (Rnw + Rpw)$, where Rnw is the deep n-well resistance and Rpw is the isolated p-well resistance. At high frequencies, the lumped well resistance functions as a shunt resistor. Minimizing Rw improves noise isolation for frequencies up to about 10 gigahertz (GHz).

Although the present invention has been described with reference to a specific embodiment, further modifications and improvements will occur to those skilled in the art. Therefore, it is intended that this invention encompass all such variations and modifications as fall within the scope of the appended claims.

What is claimed is:

1. A semiconductor device, comprising:
   a substrate;
   a buried n-well within the substrate; and
   an n-well ring extending from a surface of the semiconductor device to the buried n-well and contacting the buried n-well, wherein the n-well ring and buried n-well form an isolated p-well, the isolated p-well comprising:
      a plurality of n-well plugs extending from the surface into the isolated p-well and contacting the buried n-well; and
      a plurality of composite well ties, each composite well tie comprising a n+ active region formed on top of each of the plurality of n-well plugs for making electrical contact with the plurality of n-well plugs.

2. The semiconductor device of claim 1, further comprising a p-plus guard ring surrounding the top of each of the plurality of n-well plugs.

3. The semiconductor device of claim 1, wherein each composite well tie further comprises:
   an isolation portion between the n+ active region and the p+ guard ring of each of the plurality of n-well plugs.

4. The semiconductor device of claim 1, wherein each of the plurality of n-well plugs are spaced apart from each other at a distance of less than approximately 50 microns.

5. The semiconductor device of claim 1, wherein each of the plurality of n-well plugs are substantially evenly spaced apart.

6. The semiconductor device of claim 1, wherein each of the plurality of n-well plugs have a length in a range of approximately 0.5 microns to 1.0 microns and a width in a range of approximately 0.5 microns to 1.0 microns.

7. The semiconductor device of claim 1, wherein at least a portion of the plurality of n-well plugs form an n-well strip.

8. A semiconductor device, comprising:
   a p-type substrate;
   an isolated p-well within the p-type substrate, defined by an n-well ring and a buried n-well, wherein n-well ring and buried n-well electrically isolate the isolated p-well from the p-type substrate;
   a plurality of composite well ties within the isolated p-well, each composite well tie comprising:
      a p-type portion extending into the isolated p-well; and
      an n-type portion extending through a depth of the isolated p-well and contacting the buried n-well.

9. The semiconductor device of claim 8, wherein each composite well tie further comprises:
   an isolation portion between the p-type portion and n-type portion, wherein the n-type portion is electrically isolated from the p-type portion.

10. The semiconductor device of claim 9, wherein the isolation portions comprise inter-well shallow trench isolations.

11. The semiconductor device of claim 10, wherein each composite well tie further comprises:
    an intra-well shallow trench isolation portion around the p-type portion.

12. The semiconductor device of claim 8, wherein each of the plurality of composite well ties is spaced apart from each other at a distance of less than approximately 50 microns.

13. The semiconductor device of claim 8, wherein each of the plurality of composite well ties is substantially evenly spaced apart.

14. The semiconductor device of claim 8, wherein the n-type portions are doped with a concentration in a range of approximately 1e17 atom/cm$^3$ to 1e19 atom/cm$^3$, and the buried n-well is doped with a concentration in a range of approximately 1e17 atom/cm$^3$ to 5e19 atom/cm$^3$.

15. The semiconductor device of claim 8, wherein at least a portion of the plurality of composite well ties share an n-type portion that extends from one composite well tie to another composite well tie of the portion of composite well ties.

16. The semiconductor device of claim 8, wherein the isolated p-well further comprises an active device having a bulk electrode coupled to the p-type portion of at least one of the plurality of composite well ties.

17. The semiconductor device of claim 8, wherein the n-well ring comprises a trench isolation portion and a p-plus guard ring.

18. A semiconductor device, comprising:
    an isolated p-well defined by an n-well ring and a buried n-well, wherein the n-well ring extends along a depth of the isolated p-well and electrically contacts the buried n-well;
    a plurality of p-well ties within the isolated p-well; and
    a plurality of n-well plugs, wherein each of the plurality of n-well plugs is within a corresponding p-well tie at a predetermined spacing and extends through the depth of the isolated p-well, electrically contacting the buried n-well.

19. The semiconductor device of claim 18, further comprising:
    an isolation portion between each of the n-well plugs and the corresponding p-well tie, wherein each of the n-well plugs is electrically isolated from the corresponding p-well tie.

20. The semiconductor device of claim 18, wherein each of the plurality of n-well plugs are spaced apart from each other at a distance of less than approximately 50 microns.

* * * * *